United States Patent [19]

Lotgering et al.

[11] 4,020,475
[45] Apr. 26, 1977

[54] MAGNETIC DEVICE OPERATING WITH THE PHOTOMAGNETIC EFFECT

[75] Inventors: Frederik Karel Lotgering; Petrus Helena Gerardus Maria Vromans, both of Eindhoven, Netherlands

[73] Assignee: U.S. Philips Corporation, New York, N.Y.

[22] Filed: Oct. 17, 1975

[21] Appl. No.: 623,314

[30] Foreign Application Priority Data

Nov. 18, 1974 Netherlands ............... 7414976

[52] U.S. Cl. ............... 340/174 YC; 336/30; 336/DIG. 3
[51] Int. Cl.² ............... G11C 11/02
[58] Field of Search ............... 340/174 YC

[56] References Cited

UNITED STATES PATENTS

| | | | |
|---|---|---|---|
| 3,447,851 | 6/1969 | Remeika | 340/174 YC |
| 3,460,116 | 8/1969 | Bobeck | 340/174 YC |
| 3,566,383 | 2/1971 | Smith | 340/174 YC |
| 3,859,643 | 1/1975 | Borrelli | 340/174 YC |

OTHER PUBLICATIONS

Magnetic Bubbles, A. H. Bobeck and H. E. D. Scovil, Scientific American, June 1971, pp. 78–90.

Primary Examiner—Thomas B. Habecker
Attorney, Agent, or Firm—Frank R. Trifari; Carl P. Steinhauser

[57] ABSTRACT

A magnetic device which can be driven by means of electromagnetic radiation and has a radiation-sensitive element consisting of cobalt-doped yttrium-iron garnet. Exposure to electromagnetic radiation produces a decrease of the magnetic permeability of the element which decrease is permanent until the element is demagnetized and occurs at temperatures from 77° K to room temperature.

7 Claims, 2 Drawing Figures

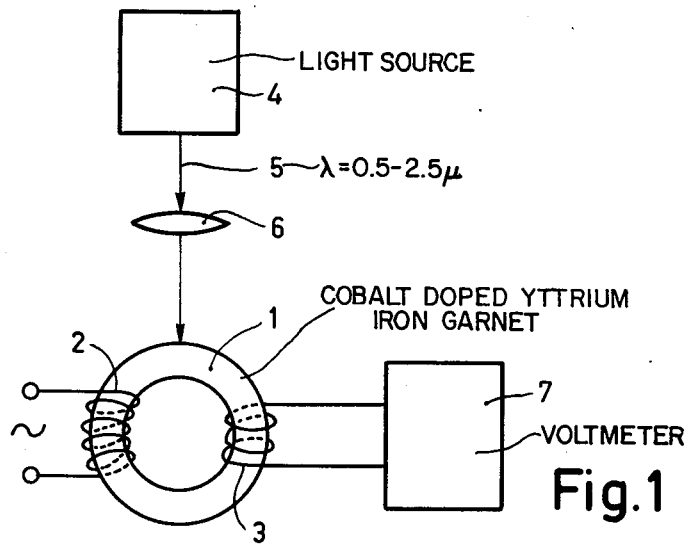
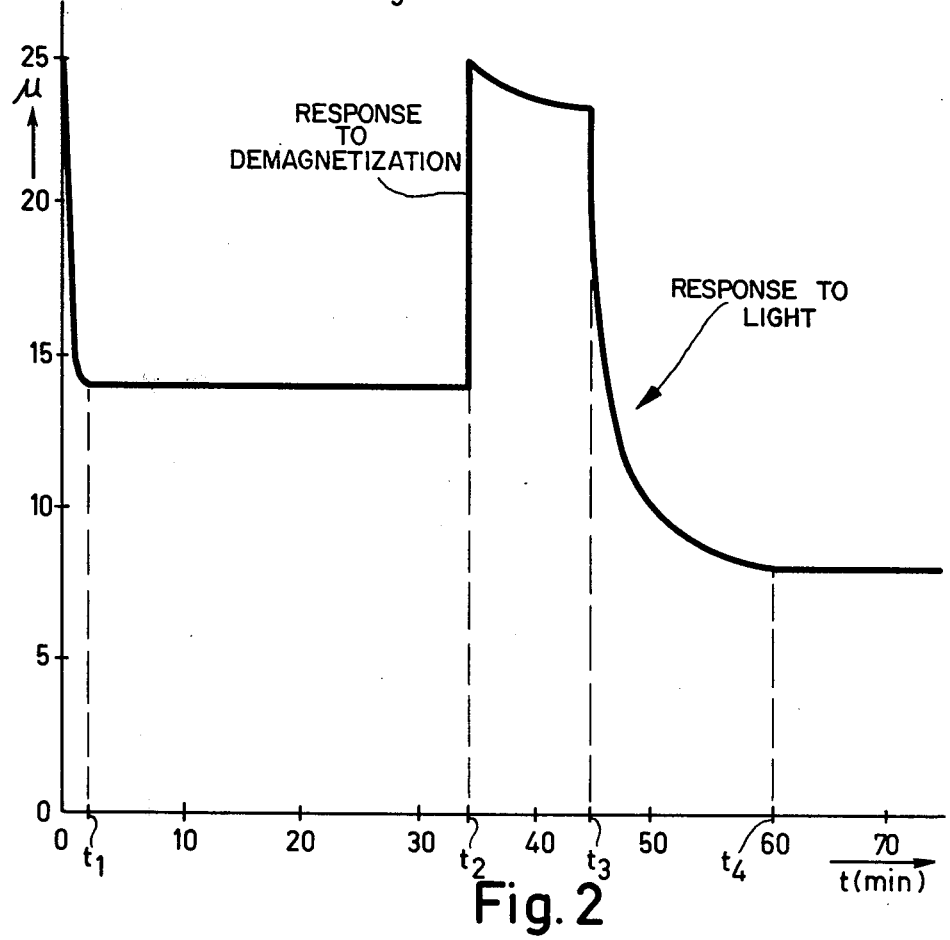

MAGNETIC DEVICE OPERATING WITH THE PHOTOMAGNETIC EFFECT

The invention relates to a megnetic device having a radiation-sensitive element which comprises a magnetisable material having garnet structure and of which a magnetic parameter can vary under the influence of electromagnetic radiation, the device comprising means to direct electromagnetic radiation onto the radiation-sensitive element and a magnetic state sensing means to detect a variation in a magnetic parameter of the magnetisable material.

Magnetisable materials in which a variation occurs in the anisotropy field, the coercive force or the magnetic permeability due to exposure to electromagnetic radiation, which phenomenon has become known in literature as "photomagnetic effect", are described in the article "Photomagnetic Effects" by U. Enz. et al, published in IEEE Transactions on Magnetics, September, 1969, MAG 5, No. 3, pp. 467–471 which relates in particular to polycrystalline, Si-doped yttrium-iron garnet ($Y_rFe_5^{+}{}_{2r}{}^{3-}$ $(Fe^{2+}Si^{4+})_rO_{12}$; $x = 0.006$).

Materials which upon radiation with electromagnetic radiation or electrons can show a "photomagnetic" effect are used as radiation-sensitive elements in magnetic devices such as intergrating radiation detectors and devices for the storage of information. In this connection a device for the storage of information may have a memory function, a logic function or a display function. Such uses are described inter alia in the published Dutch Patent Applications Nos. 6812542 and No. 6905677 and in the already mentioned article in IEEE Transactions on Magnetics, September, 1969, MAG 5.

A permanent change of, for example, the magnetic permeability is obtained in the known photomagnetic material having garnet structure by exposure to radiation at a given low temperature below 100° K. The variation produced by exposure to radiation at higher temperatures, in particular at ambient temperature, is not permanent or even absent. Erasing information recorded at a temperature below 100° K, that is restoring the material to its original magnetic state after exposure, is possible only in the known "photomagnetic" material having garnet structure by increasing the temperature (so-called thermal erasing). The fact that there it can be erased thermally only may be a drawback for certain applications.

According to the invention, a magnetic device of the above mentioned kind comprises a magnetisable material which is a cobalt-doped yttrium-iron garnet having at most 0.02 cobalt atoms per formula unit. It has surprisingly been found that Co-doped YIG is a material which shows a permanent "photomagnetic" effect with the particular property that a variation of the magnetic parameters caused by exposure to radiation can be offset by demagnetising the material (in an alternating field).

The cobalt in the material according to the invention is preferably present in the form of bivalent and trivalent cobalt since in that case the largest effects occur and/or the material contains vanadium in the order of 0.1 vanadium atom per formula unit, since in that case the extra advantage is obtained that the effect occurs at ambient temperature. Materials which show a permanent photomagentic effect at ambient temperature were not known up till now.

The invention also relates to a magnetic device having a radiation-sensitive element as mentioned above including electromagnetic means to demagnetise the magnetisable material after exposure to radiation in an alternating magnetic field having a decreasing amplitude, preferably with an initial value of at least 2 Oersted.

This enables information which has been stored in a radiation-sensitive element at a given temperature, for example, by means of local exposure to radiation of said element which contains Co-doped YIG as a photomagnetic material, to be erased at that same temperature. In this connection it is to be noted that, after erasing, fresh information may be stored and that said process may be repeated over and over again.

The invention also relates to a device as described above in which the magnetic state sensing means is designed to detect a vatiation in the magnetic permeability and that the variation to be detected is a decrease of the magnetic permeability.

The invention will be described in greater detail with reference to the drawing.

In the drawing,

FIG. 1 shows diagrammatically a device used to measure the variation of the magnetic permeability $\mu$ of a Co-doped YIG specimen upon exposure to light.

FIG. 2 is a graph showing the variation of the magnetic permeability $\mu$ of a co-doped YIG specimen under the influence of exposure to light.

The specimens used were manufactured as follows. Sulphate solutions of the metals present in the composition were subjected to a spray-drying treatment and the sulphates were decomposed in air at 1150° C. Herewith it was possible to effect a good dispersion of the Co-dopes which were very low in themselves. The resulting powder was disagglomerated and compressed isostatically to pills under a pressure of 10Kbar. Said pills were sintered in oxygen at a temperature of 1425° C for 5 hours and then cooled slowly. The resulting specimens showed a pure garnet phase and had a density which was only a few permille lower than the rontgen density.

FIG. 1 shows an annular cobalt-YIG specimen 1 having an outer diameter of 3mm, an inner diameter of 2mm and a height of 1mm and which, for measuring the permeability, comprises a primary 2, to which an alternating current is supplied, and a secondary 3. This and a number of similar specimens were subjected to permeability measurements in an alternating field having an amplitude of a few hundredths of an Oersted and a frequency of 10 kHz. The voltage which is induced in the secondary 3 and which is a measure of the magnetic permeability is measured by means of the device 7. These specimens were exposed to light from light source 4 which produces a radiation beam 5 of a wavelength for which the specimens to be exposed are sensitive (in the present case this is the wavelength range from 0.5 micron to 2.5 microns) and with an approximately constant intensity of 5W/sq.cm. The radiation is directed onto the specimen 1 via the lens 6. In order to prevent the permeability being influenced by rises in temperature upon switching on the light source, the specimen 1 was placed in a liquid nitrogen-containing vessel for measurements at 77° K, and in a flow of ethanol, respectively, for measurements at 253° K or 283° K.

The results obtained are recorded in the following Table.

Table

| No | $(Y_{3-p}P_p)(Fe_{5-q}Q_q)O_{12}$ | | Valencies | $\mu_o$ | $\Delta \mu_{sat}^{-1}$ | Temp. (°K) |
|---|---|---|---|---|---|---|
|  | $P_p$ | $Q_q$ |  |  |  |  |
| 1 | $Ca_{0.006}$ | $V_{0.03}Co_{0.01}$ | $V^{5+}+Co^{3+}+$ | 24.8 | 0.21 | 77 |
|  |  |  | $Co^{2+}$ | 32 | 0.05 | 283 |
| 4 | $Ca_{0.2}$ | $In_{0.3}V_{0.1}$- | $V^{5+}+Co^{3+}+$ | 21.8 | 0.05 | 77 |
|  |  | $Co_{0.01}$ | $Co^{2+}$ | 70 | 0.013 | 283 |
| 5 | $Ca_{0.06}$ | $V_{0.03}Mn_{0.03}$- | $V^{5+}+Mn^{3+}+$ | 39.8 | 0.02 | 77 |
|  |  | $Co_{0.001}$ | $Mn^{2+}+Co^{2+}$ | 56 | 0.00 | 248 |
| 6 |  | $Mn_{0.025}$- | $Mn^{3+}+Mn^{2+}$ | 9.9 | 0.01 | 77 |
|  |  | $Co_{0.005}$ | $Co^{2+}$ | 30 | 0.00 | 283 |
| 8 |  | $Mn_{0.01}$ | $Mn^{3+}+Co^{3+}+$ | 3.46 | 0.05 | 77 |
|  |  | $Co_{0.02}$ | $Co^{2+}$ | 9.5 | 0.00 | 253 |
| 9 |  | $Si_{0.015}$- | $Co^{3+}+Co^{2+}$ | ≅1 | — | 77 |
|  |  | $Co_{0.035}$ |  |  |  |  |
| 10 | $Ca_{0.06}$ | $V_{0.03}Mn_{0.02}$ |  | 50 | 0.00 | 77 |
|  |  |  |  | 80 | 0.00 | 283 |

The first column in the table denotes the number of the specimen which was measured and the second column indicates the composition of the specimen in question, there being distinguished between the substitution P in behalf of charge compensation (in the present case Ca has been used for this but other dopes may also be used for purpose) and the substitution Q which produces and influences, respectively, the photomagnetic effect. The third column denotes the assumed valencies of the substitutions which are assumed to be of importance for the photomagnetic effect. $\mu_o$ in the fouth column denotes the permeability immediately after demagnetisation and $\Delta \mu^{-1}{}_{sat}$ in the fifth column denotes the reciprocal value of the saturation value of the permeability after exposure, $\mu^{-1}{}_{sat}$, minus the reciprocal value of the permeability immediately after demagnetisation, $\mu_o^{-1}$. The temperatures at which the measurements were carried out are recorded in the last column.

In the examples of the table the cobalt contents vary from 0.001 atoms per formula unit to 0.035 atoms per formula unit. Specimens having less than 0.001 Co cannot be manufactured or cannot be manufactured in a reproducible manner, while with 0.035 Co the permeability is substantially equal to 1 and possibly occuring photomagnetic effects can no longer be measured. Specimen 10 which contains no Co shows no photomagnetic effect. The specimens 1 and 4 which contain bivalent and trivalent cobalt and pentavalent vanadium show the largest effects, and in particular effects at room temperature.

FIG. 2 shows as a characteristic case how the magnetic permeability of the specimen 1 which was kept in the dark at 77° K varies when the exposure is started at the instant $t = 0$. After switching off the exposure at the instant $t_1$ it appears that said variation is maintained. At the instant $t_2$ an alternating magnetic field decreasing in value is applied as a result of the which magnetic permeability returns to its original value. The initial value of the alternating field was approximately 3 Oersted, which proved to be sufficient for the demagnetisation, although the material is not magnetically saturated even in a field of 6 Oersted. At the instant $t_3$ there is exposed again (and longer than the first time) and at the instant $t_4$ exposure is discontinues. So the process can be repeated. In addition the value of the $\mu$-decrease proves to be dependent on the duration of the exposure. Similar effects are found at room temperature (283° K).

As regards the already mentioned $Fe^{2+}$-containing, Si-doped YIG which is known from literature and shows a photomagnetic effect below 100° K, the occurrence of the "photomagnetic" effect is ascribed to a redistribution of $Fe^{2+}$ and $Fe^{3+}$ ions in equivalent lattice places in the crystal caused by exposure. In the present series of materials no $Fe^{2+}$ is present and the occurrence of the photomagnetic effect is based on another mechanism. (in order to counteract the possible presence of $Fe^{2+}$ ions, the materials according to the invention preferably contain dopes which are capable of oxidizing ferro-ions. $Mn^{3+}$, for example, is suitable in this connection).

What is claimed is:

1. A magnetic device having a radiation-sensitive element which comprises a magnetisable material having garnet structure and of which a magnetic parameter can vary under the influence of electromagnetic radiation, the device comprising means to direct electromagnetic radiation onto the radiation-sensitive element, and a magnetic state sensing means to detect a variation in a magnetic parameter of the magnetisable material, said magnetisable material being cobalt doped yttrium-iron garnet having at most 0.02 cobalt atoms per formula Unit.

2. A device as claimed in claim 1, wherein the cobalt is present in the form of bivalent and trivalent cobalt.

3. A device as claimed in claim 1 wherein the cobalt-doped yttrium-iron garnet contains vanadium in the order of 0.1 vanadium atoms per formula unit and that the device can be operated at room temperature.

4. A device as claimed in claim 1 wherein the cobalt-doped yttrium-iron garnet contains further dopes which are capable of oxidizing ferro-ions.

5. A device as claimed in claim 1, wherein in the cobalt-doped yttrium-iron garnet a part of the yttrium is replaced by charge-compensating dopes.

6. A device as claimed in claim 1, wherein the device comprises electromagnetic means to demagnetise the magnetisable material after exposure in an alternating magnetic field with decreasing amplitude.

7. A device as claimed in claim 1, wherein the magnetic state sensing means is designed to detect a variation in the magnetic permeability and that the variation to be detected is a decrease of the magnetic permeability.

* * * * *